July 6, 1965

R. J. C. CHUEH 3,193,704

PULSE AMPLIFIER

Filed July 27, 1962

2 Sheets-Sheet 1

INVENTOR

RICHARD J. C. CHUEH

BY

B. L. Zangwill

ATTORNEY

INVENTOR
RICHARD J. C. CHUEH

BY

B. L. Zangwill
ATTORNEY

3,193,704
PULSE AMPLIFIER

Richard J. C. Chueh, Philadelphia, Pa., assignor, by mesne assignments, to the United States of America as represented by the Secretary of the Navy

Filed July 27, 1962, Ser. No. 213,065
5 Claims. (Cl. 307—88.5)

This invention relates to pulse amplifiers, and more particularly relates to asynchronous pulse amplifiers with a short rise time for use in computers.

Pulse amplifiers are the basic building block of computers. Their speed of operation is a primary factor in the overall speed of the computer. There is great economic pressure to increase speed of operation of computers and this requires components which operate faster than conventional vacuum tube devices or transistor devices which operate on a minority carrier principle.

It is also desirable for pulse amplifiers that are to be used in computer application to be asynchronous in operation to have the width of the output pulse the same as the width of the input pulse, and to provide a flat-top output pulse with no undershoot. It is desirable to use asynchronous components so as to avoid the necessity for timing-pulse generators. The pulse amplifiers should provide an output which has a flat top of the same width as the input pulse because many of the memory cells which are used in computers will not operate properly when receiving pulses that have undershoot or overshoot.

Accordingly, it is an object of the present invention to provide a fast operating, asynchronous pulse amplifier for use in computer applications.

Another object of this invention is to provide a tunnel diode pulse amplifier which has a flat-top pulse output with no undershoot.

It is a further object of this invention to provide a bistable-monostable logic amplifier in which the output pulse is derived from a bistable tunnel diode circuit which is reset by a monostable tunnel diode circuit.

In one illustrative embodiment of this invention a tunnel diode which is biased so as to be bistable is placed in parallel with a tunnel diode which is biased so as to be monostable. The input pulse sets the tunnel diode which is biased to be bistable. The leading edge and trailing edge of the input pulse are each differentiated so as to provide a leading-edge pulse and a trailing edge pulse. The trailing edge pulse is amplified by the monostable tunnel diode and is then used to reset the bistable tunnel diode. The output pulse has a flat-top which is characteristic of bistable devices, and yet the amplifier is free of the timing restrictions associated with amplifiers that depend on clocking sources or pulsed power supplies.

Other objects and many of the attendant advantages of this invention will be readily appreciated as the same becomes better understood by reference to the following detailed description when considered in connection with accompanying drawings wherein.

Figure 1:
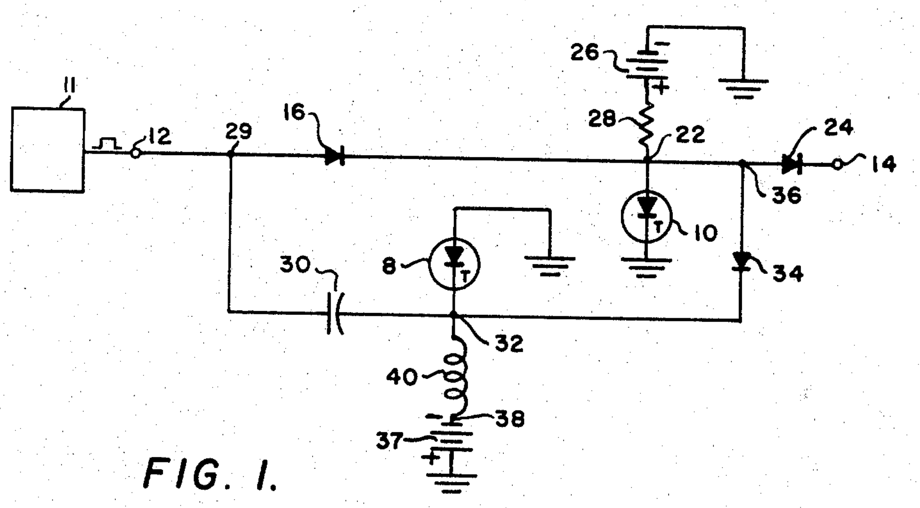
FIG. 1 is a schematic circuit diagram of a pulse amplifier which is one embodiment of the invention.

Referring now particularly to FIG. 1, a pulse amplifier is shown which utilizes tunnel diodes 8 and 10. The input to the pulse amplifier comprises rectangular shaped pulses provided by means 11. When an input pulse is applied to input terminal 12, the circuit causes an output pulse to appear at output terminal 14. This output pulse has a fixed amplitude and a flat top. It is of the same width as the input pulse.

Terminal 12 is electrically connected in series with a tunnel rectifier 16, terminal 22, tunnel rectifier 24 and output terminal 14. Tunnel rectifiers 16 and 24 are connected such as to pass only positive pulses from input terminal 12 to output terminal 14. Terminal 22 is connected to the anode of tunnel diode 10 so that a positive pulse on terminal 12 will bias this tunnel diode into its high state. The cathode of tunnel diode 10 is connected to ground. A biasing circuit consisting of D.C. voltage 26 and resistor 28 in series, is also connected to terminal 22 and biases tunnel diode 10 into bistable mode.

Terminal 12 is also electrically connected to the series combination of junction 29, capacitor 30, terminal 32, tunnel rectifier 34, and junction 36. This series circuit is in parallel with tunnel rectifier 16 and terminal 22 described above. Junction 36 is electrically connected to terminal 22 on the anode of tunnel diode 10 and to the anode of tunnel rectifier 24. Tunnel rectifier 34 is connected so as to offer high resistance to positive pulses passing between terminal 12 and terminal 36 and low resistance to negative reset pulses generated by monostable biased tunnel diode 8. Terminal 32 is connected to the cathode of tunnel diode 8; the anode of tunnel diode 8 is connected to ground. A biasing circuit for tunnel diode 8 which consists of D.C. voltage source 37, and inductor 40, connected in series, is connected to terminal 32 and biases tunnel diode 8 so as to be in the monostable mode of operation.

A positive pulse applied to terminal 12 sets tunnel diode 10 into the high voltage state thus producing an output voltage of constant amplitude at terminal 14. The leading edge of this pulse is differentiated by the capacitor 30 to produce a sharp positive trigger voltage. However, this positive trigger voltage does not trigger tunnel diode 8, since this diode is reverse connected. The trailing edge of the input pulse at terminal 14 is also differentiated to produce a sharp negative trigger voltage. This trigger voltage triggers tunnel diode 8 and generates a large negative reset pulse. The negative reset pulse passes through tunnel rectifier 34 and resets tunnel diode 10 to the low voltage state. The output terminal 14 is isolated from this negative reset pulse by diode 24. It can be seen that the output pulse will have the flat top characteristic obtained by bistable operation and yet will be asynchronous since it is reset by tunnel diode 8.

The capacitor 30 and the inductor 40 form a common type of differentiation circuit. However, the mechanism of this circuit is not relied upon in the present invention. In fact, the differentiation will take place even if capacitor 30 is omitted. The tunnel diode 8 and the inductor 40 are independently capable of performing differentiation.

Figure 2:
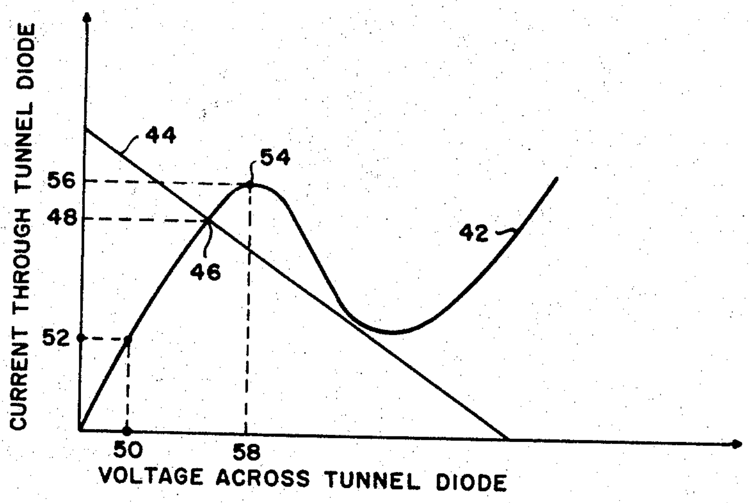
FIG. 2 is the current-voltage characteristic curve of the monostable-biased tunnel diode 8 shown in FIG. 1.

Tunnel diode 8 is biased for monostable operation as shown by its operating curve and load line in FIG. 2. In FIG. 2, 42 is a curve of a current through tunnel diode 8 plotted against the voltage across it and 44 is the load line determined by the biasing circuit of this tunnel diode and intersects the operating curve 42 at one point 46 to provide monostable operation. The leading edge of a pulse applied to terminal 12 will be differentiated by capacitor 30 and appear as a positive trigger pulse at terminal 32. A current, shown as point 48 on the ordinate of operation curve in FIG. 2, flows through tunnel diode 8, terminal 32, and inductor 40, to battery source 37.

The positive trigger pulse, which was caused by differentiating the leading edge of the input pulse, causes the operating point of tunnel diode 8 to move to some lower voltage point 50 having a current value 52 which is of lesser magnitude than 48. So tunnel diode will not be triggered. Next, the trailing edge of the input pulse to terminal 12 is differentiated by capacitor 30 to appear as a negative pulse at terminal 32. This moves the operating point at tunnel diode 8 to point 54 along characteristic curve 42 having a voltage 58 and a current 56. Since current 56 is larger than peak current of tunnel diode 8, the tunnel diode will be triggered and go through a standard cycle of monostable operation to generate a voltage pulse. This voltage pulse appears at terminal 32 as a negative reset voltage and is passed by diode 34 to terminal 36. This negative reset pulse occurs at the anode of tunnel diode 10 and triggers it from the high voltage state to the low voltage state. It is blocked from output terminal 14 by tunnel diode rectifier 24.

Figure 3:
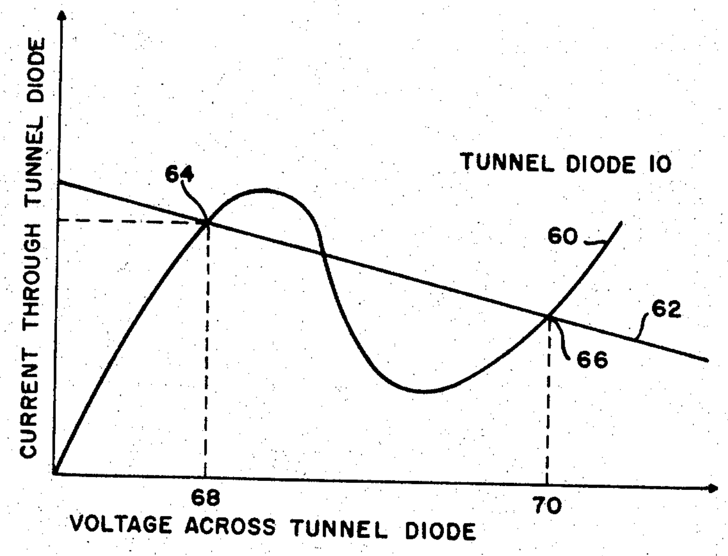
FIG. 3 is the current-voltage characteristic of the bistable biased tunnel diode 10 shown in FIG. 1.

Tunnel diode 10 is biased so as to be bistable. Its operating curve 60, as shown in FIG. 3 is intercepted by load line 62 so as to form two stable points of operation 64 and 66. In the absence of an input pulse, tunnel diode 10 is in the voltage state indicated by 64, and a relatively low output voltage 68, shown on the abscissa of the operating curve 60 in FIG. 3, appears at output terminal 14. When a positive voltage is applied to terminal 12 the operating point of tunnel diode 10 is moved along its characteristic curve to point 66 which is also a stable point of operation. When tunnel diode 10 is operating about point 66, a relatively high output voltage 70, as shown along the abscissa of the graph of FIG. 3, appears at output terminal 14. The trailing edge of the input pulse is differentiated and amplified by tunnel diode 8 and appears as a negative reset pulse at the anode of tunnel diode 10. This reset pulse moves the operating point of tunnel diode 10 back along its characteristic curve to stable point of operation 64, and a relatively low output voltage, indicated at 68, appears at terminal 14.

The voltage source 26 and resistance 28 makes a constant-current supply, and should be such that to have a bias current which is close to the peak current of the tunnel diode. A typical layout of the circuit of FIG. 1 will be as follows. The tunnel diodes 10 and 8 have a peak current of 10 milliampere an equivalent capacitance of five micro-micro-farads, and a negative conductance of $1/15$ of a mho. In the biasing circuit for tunnel diode 10, the voltage source 26 should be approximately 16 volts and the resistor 28 should be approximately 2 kilo-ohms. The capacitor 30 should be approximately 12 micro-micro-farads. In the biasing circuit for tunnel diode 8, the D.C. voltage source 37 should be approximately one-tenth of a volt, and the inductor 40 should have an inductance of approximately 0.22 micro-henrys. Tunnel rectifiers 16, 24, and 34 have an equivalent capacitance of less than 3 micro-micro-farads; a back voltage larger than 400 mv. and forward resistance less than 12 ohms.

Tunnel diodes are used as the components for the pulse amplifier primarily because of their very rapid switching speed. The tunnel diode is a single p-n junction in which both the p-type and n-type regions are degenerate with a high impurity concentration which is usually greater than $5\times10^{19}$ per cubic centimeter for silicon and greater than $2\times10^{19}$ per cubic centimeter for germanium. This junction must be very narrow and on the order of one hundred and fifty Angstroms. In this junction there are some electrons in the n-material conduction band that have the same amount of energy as some electrons in the p-material valence band. With a small amount of positive bias the junction barrier is decreased and n-material conduction electrons are situated opposite p-material available state with the same level of energy. According to quantum mechanics theory there is a finite probability that an electron originally on one side of this junction can appear on the other side at the same energy level by tunneling through the barrier at the speed of light. This phenomenon requires no minority carrier storage and therefore provides a much faster operating device, limited only by the associated diode capacitance. The tunnel diode tends to be high-current low-voltage device with a large negative conductance.

Figure 4:
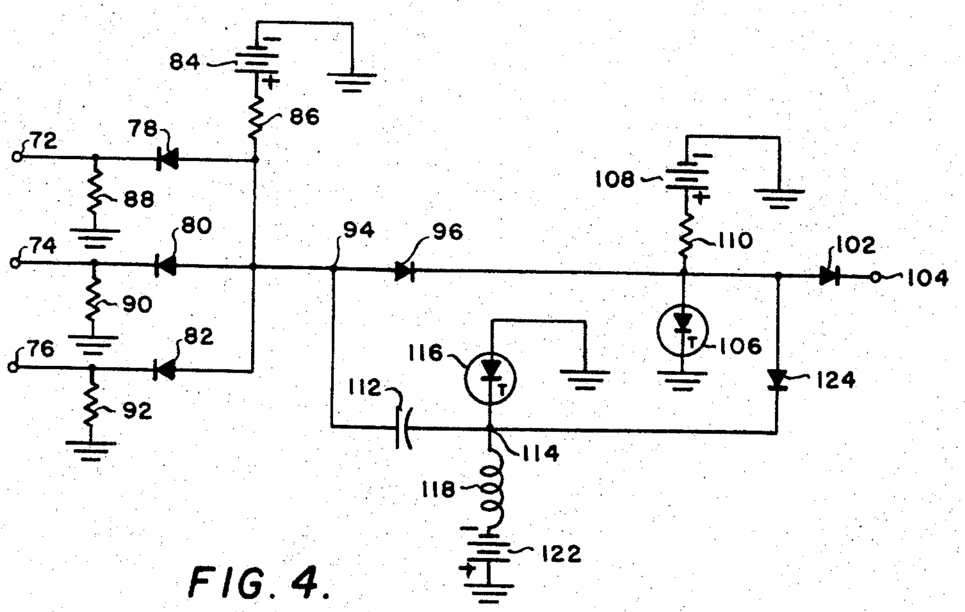
FIG. 4 is a schematic circuit diagram of an "AND" circuit which utilizes the pulse amplifier of FIG. 1.

The circuit of FIG. 4 is an "AND" gate utilizing the pulse amplifier of FIG. 1. Three input terminals 72, 74 and 76 are shown for the "AND" gate. There is a tunnel rectifier in series with each of these input terminals; These are 78, 80 and 82 respectively. A D.C. voltage source 84 is connected through a resistor 86 to the anode of each of the tunnel rectifiers 78, 80 and 82; The input terminals are connected to the cathode of these rectifiers. The cathodes of each of the tunnel diode rectifiers 78, 80 and 82 are connected to ground through resistors 88, 90 and 92 respectively. In the absence of a positive input pulse to each of the terminals 72, 74 and 76, three parallel low impedance paths are provided for current flow from voltage source 84 through resistor 86 and to ground by way of any of the three input circuits. However, a positive input pulse to any one terminal will block the rectifier which is in series with it and thereby block one of the parallel paths. If any one of the three low impedance paths are open most of the voltage from source 84 will be dropped across resistor 86 so as not to affect the input to the pulse amplifier at terminal 94. However, if an input pulse appears at all three terminals 72, 74 and 76 simultaneously, the current flow through these low impedance paths will be prevented and the voltage will not be dropped across resistor 86. In this case an input pulse will appear at junction 94.

This input pulse is passed by rectifier 96, and appears at the anode of tunnel diode 106 which is biased so as to operate in the bistable mode by D.C. source 108 and resistor 110. Tunnel diode 106 is set to the high voltage state by this input voltage. While tunnel diode 106 is in the high voltage state, an output pulse will appear at 104 which is of constant amplitude and of substantially flat top. Tunnel diode 116 is biased so as to be monostable by the biasing circuit consisting of inductor 118 and D.C. voltage source 122. The input pulse at junction 94 is also conducted to condenser 112 where differentiation occurs. This differentiation creates a postive trigger pulse at the leading edge of the input pulse and a negative trigger pulse at its trailing edge. The leading-edge trigger pulse is passed through tunnel diode 116 to ground without triggering it; the trailing edge pulse triggers tunnel diode 116, which is monostable biased, and generates a reset pulse. This negative pulse resets tunnel diode 106, dropping the output at terminal 104 to the low voltage state. Therefore an output pulse will only occur at terminal 104 when there is an input pulse to all three of the terminals 72, 74 and 76. Thus, this is a logical "AND" operation.

This tunnel diode pulse amplifier is especially suitable for computer application. It is asynchronous in operation and yet has a flat top output pulse with substantially no overshoot or undershoot. The amplifier is also exceptionally fast in operation and compatible with simple diode logic circuitry such as that shown in FIG. 4.

Obviously many modifications and variations of the present invention are possible in the light of the above teachings. It is therefore to be understood that within the scope of the appended claims the invention may be practiced otherwise than as specifically described.

What is claimed is:

1. A pulse amplifier comprising:
a first junction;
a second junction;
means connected to said first junction and providing thereto a rectangular shaped input pulse having a leading and trailing edge;
first isolation means connected to said first junction;
bistable tunnel diode means connected between said first isolation means and said second junction, said bistable tunnel diode means being switched from a first state to a second state by the leading edge of said input pulse;

second isolation means connected to said second junction;

means connected between said first junction and said second isolation means including monostable tunnel diode means, said monostable tunnel diode means providing a reset pulse to said tunnel diode bistable means in response to the trailing edge of said input pulse to switch said tunnel diode bistable means from said second state to said first state;

and output circuit means electrically connected to said second junction point, wherein an amplified replica of said input pulse appears on said output circuit means in response to the switching of said bistable means.

2. A pulse amplifier according to claim 1 wherein said first isolation means comprises a first diode rectifier for passing only positive pulses from said first junction to said bistable means.

3. A pulse amplifier according to claim 1 wherein said second isolation means comprises a second diode rectifier for passing only negative pulses from said monostable means.

4. A pulse amplifier according to claim 1 wherein said output circuit means comprises:

an output terminal; and a third diode rectifier connected between said second junction and said output terminal for passing only positive pulses produced by said bistable means from said output terminal.

5. A pulse amplifier comprising:

a first junction;

a second junction;

means connected to said first junction and providing thereto a rectangular shaped input pulse having a leading and trailing edge;

a first diode rectifier connected to said first junction;

bistable tunnel diode means connected between said first diode rectifier and said second junction, said bistable tunnel diode means being switched from a first state to a second state by the leading edge of said input pulse;

a second diode rectifier connected to said second junction;

means connected between said first junction and said second diode rectifier including a monostable tunnel diode means, said monostable tunnel diode means providing a reset pulse to said tunnel diode bistable means in response to the trailing edge of said input pulse to switch said tunnel diode bistable means from said second state to said first state;

and output circuit means including a third diode rectifier connected to said second junction and an output terminal, wherein an amplified replica of said input pulse appears on said output circuit in response to the switching of said bistable means.

References Cited by the Examiner

UNITED STATES PATENTS

| | | | |
|---|---|---|---|
| 2,644,094 | 6/53 | Douglas | 328—58 |
| 2,794,123 | 5/57 | Younker | 328—190 |
| 3,069,627 | 12/62 | Giesecke | 328—59 |
| 3,121,176 | 2/64 | Burns et al. | 307—88.5 |

OTHER REFERENCES

"Monostable Tunnel Diode Circuit," by Richard H. Bergman, RCA Technical Notes, TN No. 463, September 1961.

JOHN W. HUCKERT, *Primary Examiner.*

ARTHUR GAUSS, *Examiner.*